(12) United States Patent
Quinn et al.

(10) Patent No.: US 7,433,377 B2
(45) Date of Patent: Oct. 7, 2008

(54) LASER DRIVE METHOD AND APPARATUS

(75) Inventors: Patrick A. Quinn, Aloha, OR (US);
Chung-Chieh Yu, Beaverton, OR (US)

(73) Assignee: Null Networks LLC, Las Vegas, NV (US)

( * ) Notice: Subject to any disclaimer, the term of this patent is extended or adjusted under 35 U.S.C. 154(b) by 451 days.

(21) Appl. No.: 10/444,460

(22) Filed: May 22, 2003

(65) Prior Publication Data

US 2004/0233948 A1     Nov. 25, 2004

(51) Int. Cl.
*H01S 3/00*     (2006.01)
(52) U.S. Cl. ............... 372/38.02; 372/38.01; 372/38.07
(58) Field of Classification Search ............... 372/38.02
See application file for complete search history.

(56) References Cited

U.S. PATENT DOCUMENTS 5,140,175 A * 8/1992 Yagi et al. ............... 327/109
5,157,675 A * 10/1992 Takagi ............... 372/24
5,303,248 A * 4/1994 Gibbs ............... 372/25
6,091,747 A * 7/2000 Morita et al. ............... 372/38.02
6,535,534 B1 * 3/2003 Fischer ............... 372/38.07
6,870,389 B2 * 3/2005 Fattaruso ............... 326/26

* cited by examiner

*Primary Examiner*—Minsun Harvey
*Assistant Examiner*—Phillip Nguyen
(74) *Attorney, Agent, or Firm*—Schwabe, Williamson & Wyatt P.C.

(57) ABSTRACT

A laser diode is employed to output light. A laser driver is employed to drive the laser diode. A laser driver control unit is employed to control the driving, such that carrier concentration of the laser is substantially forced to a desired concentration as photon level of the laser initially arrives at a desired level. In one embodiment, the laser driver outputs a drive pulse to drive the laser diode, with the drive pulse having a complex waveform. In one embodiment, the complex waveform includes different transition time periods, and transient rates to raise the drive pulse from an initial level to a peak level. In another embodiment, the complex waveform includes different transition time periods and transient rates to raise the drive pulse from an initial level to a transition peak level and then drop the drive pulse back to an intermediate low level and then finally transition to a final peak level.

10 Claims, 8 Drawing Sheets

Tailored Pulse

LASER DRIVE METHOD AND APPARATUS

BACKGROUND OF THE INVENTION

1. Field of the Invention

The present invention relates to the fields of laser, integrated circuit, networking, and data communication. More specifically, the present invention relates to laser driving techniques having particular applications for data communication and networking.

2. Background Information

With advances in integrated circuit, microprocessor, networking and communication technologies, an increasing number of devices, in particular, digital computing devices, are being networked together.

Examples of computing devices include servers, personal computers and "special" purpose computing devices. Personal computers may have form factors, such as desktop, laptop, tablet, and so forth. "Special" purpose computing devices may include personal digital assistants (PDA), wireless mobile phones and so forth.

The various computing devices are often first coupled to a wired or wireless local area network (LAN), such as an Ethernet based office/home network. In turn, the local area networks are interconnected together through wired or wireless wide area networks (WAN), such as SONET networks, ATM networks, Frame Relays, and the like. Of particular importance is the TCP/IP based global inter-network, the Internet.

As a result of this trend of increased connectivity, an increasing number of applications that are network dependent are being deployed. Examples of these network dependent applications include but are not limited to, the world wide web (WWW), email, Internet based telephony, and various types of e-commerce and enterprise applications.

The success of many content/service providers as well as commerce sites depend on high speed delivery of a large volume of data across wide areas. As a result, high speed data trafficking devices, such as high speed optical, or optical-electro routers, switches and so forth, (hereinafter collectively referred to as optical networking devices), are needed.

Many optical networking devices are laser based, include networking interfaces with components to output lights encoded with the data to be communicated between the devices. Often, a laser diode is employed to output light, and a laser driver is employed to drive the laser diode.

FIG. 8 illustrates a typical drive pulse employed by a laser driver to drive a laser diode under the prior art, and the resulting light power outputted by the laser diode. Drive pulse 800 is a simple waveform including a rising portion 802 where drive pulse 800 rises from an initial current level to a peak current level at a very fast transition rate, taking a very small fraction of a nanosecond, a steady portion 804 where drive pulse 800 is sustained at the peak current level for a duration, and a falling portion 806 where drive pulse 800 falls/drops from the peak current level back to the initial current level at a very fast transition rate, taking also only a very small fraction of a nanosecond.

As illustrated, the laser output 850 typically has overshoot 862 as well as undershoot 864 before it can settle at a desired output level 854 or back at a "rest" level 852. Overshoot 862 and undershoot 864 are undesirable, as they impair the quality of laser output 850. However, under the prior art, the effects are believed to be unavoidable, and the phenomenon is referred to as the relaxation oscillation effect.

Thus, it will be desirable to tame the relaxation oscillation effect when driving a laser, i.e. reduce the amount of overshoot and/or undershoot.

GLOSSARY

| | |
|---|---|
| ATM | Asynchronous Transmission Mode |
| OIF | Optical Internetworking Forum |
| SONET | Synchronous Optical network, a PHY telecommunication protocol |
| SPI-4 | System Packet Interface Level 4 |
| TCP/IP | Transmission Control Protocol/Internet Protocol |

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

The present invention includes laser driving methods and related apparatuses. The apparatuses may be integrated circuits, circuit boards, or devices.

In the following description, various configurations, combinatorial logics, and so forth will be described, to provide a thorough understanding of the present invention. However, the present invention may be practiced without some of the specific details or with alternate storage elements and/or combinatorial logics. In other instances, well-known features are omitted or simplified in order not to obscure the present invention.

The phrase "in one embodiment" is used repeated. The phrase ordinarily does not refer to the same embodiment, although it may. The terms "comprising", "having", "including" and the like, as used in the present application, including in the claims, are synonymous.

Figure 1:
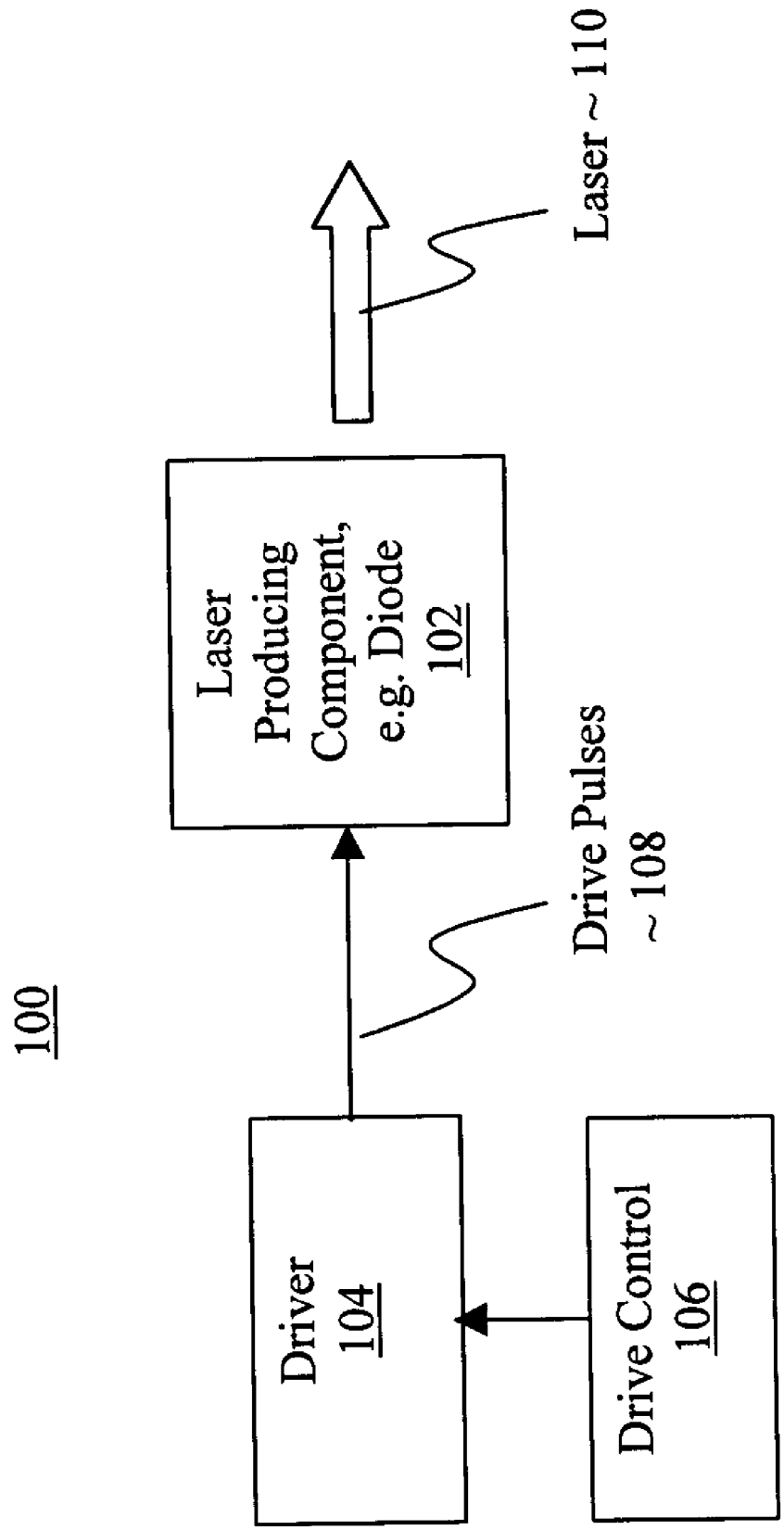
FIG. 1 illustrates a function block view of the present invention, in accordance with one embodiment.

Referring now to FIG. 1, wherein a block diagram illustrating a function block view of the present invention, in accordance with one embodiment, is shown. As illustrated, novel laser driving arrangement 100 of the present invention includes light producing component (LPC) 102, such as a laser diode (hereafter generally referred to as a laser), laser driver 104 and laser drive control unit 106, operationally coupled to each other as shown. Laser 102 is employed to output light 110. Laser driver 104 is employed to furnish laser 102 with current (or voltage) drive pulses 108, and laser driver control unit 106 is employed to control the driving of laser 102 by laser driver 104. In industry, a component called a "laser driver" may contain laser driver control unit functions within the component, external to the component, or a combination of both.

Figure 2:
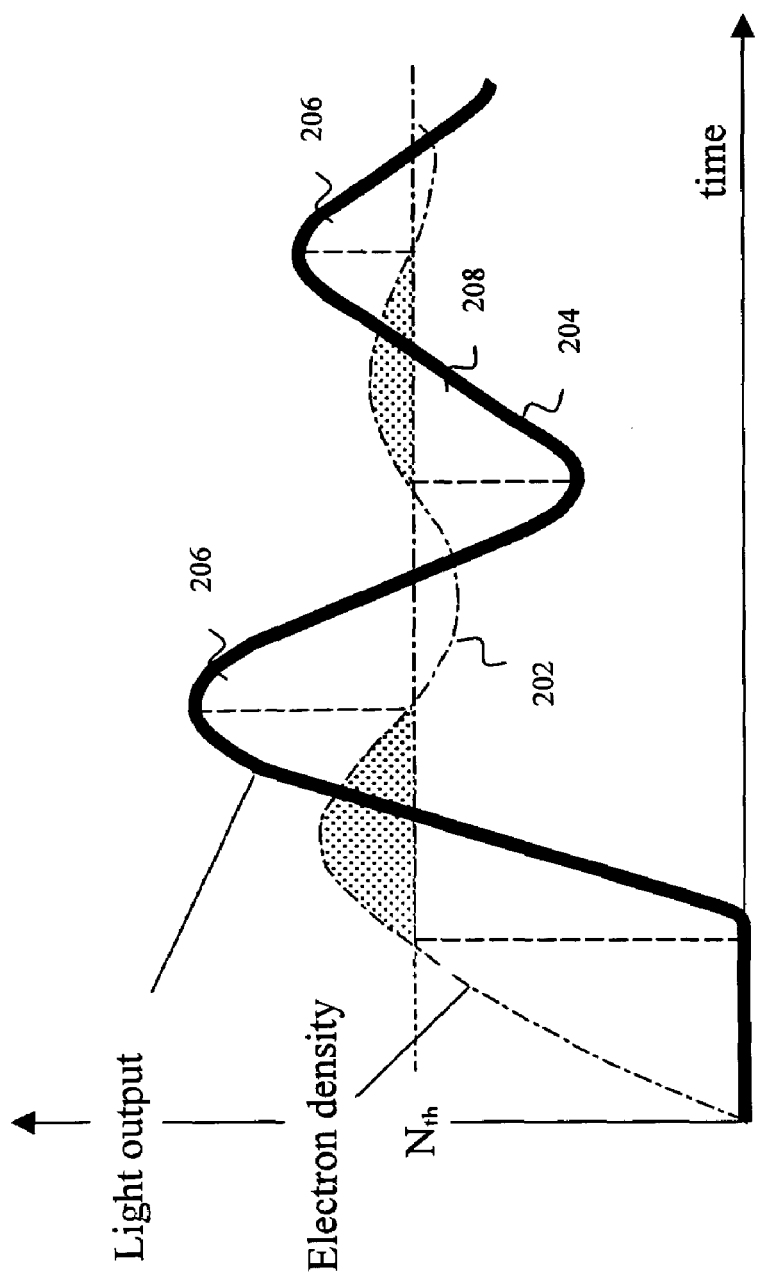
FIG. 2 illustrates the relationship between carrier concentration and photon level as understood under the prior art.

Referring now briefly to FIG. 2, wherein the relationship between carrier concentration and photon level of a laser as understood in the prior art is illustrated. As shown, in response to the application of a current through a laser diode, carrier concentration within the laser is understood to rise as depicted by electron density level 202. Further, the photon output is understood to "modulate" as depicted by "light output" 204. Overshoot 206 and undershoot 208 were believed to be unavoidable, and referred to as the relaxation oscillation effect, as described earlier.

However, the present invention discovered that if the carrier concentration of a laser can be substantially forced to a desired final-value concentration as photon level of the laser initially arrives at a desired level, the relaxation oscillation effect may be substantially reduced or even eliminated.

Referring back to FIG. 1, in accordance with the present invention, laser driver control unit 106 is employed to control the driving of LPC (laser) 102 by laser driver 104, in a manner, such that carrier concentration of laser 102 is substantially forced to a desired concentration as photon level of laser 102 initially arrives at a desired level. In various embodiments, as will be described in more detail below, the desired coincidence of carrier concentration and photon level is achieved by using driving pulses with complex waveforms.

Figure 8:
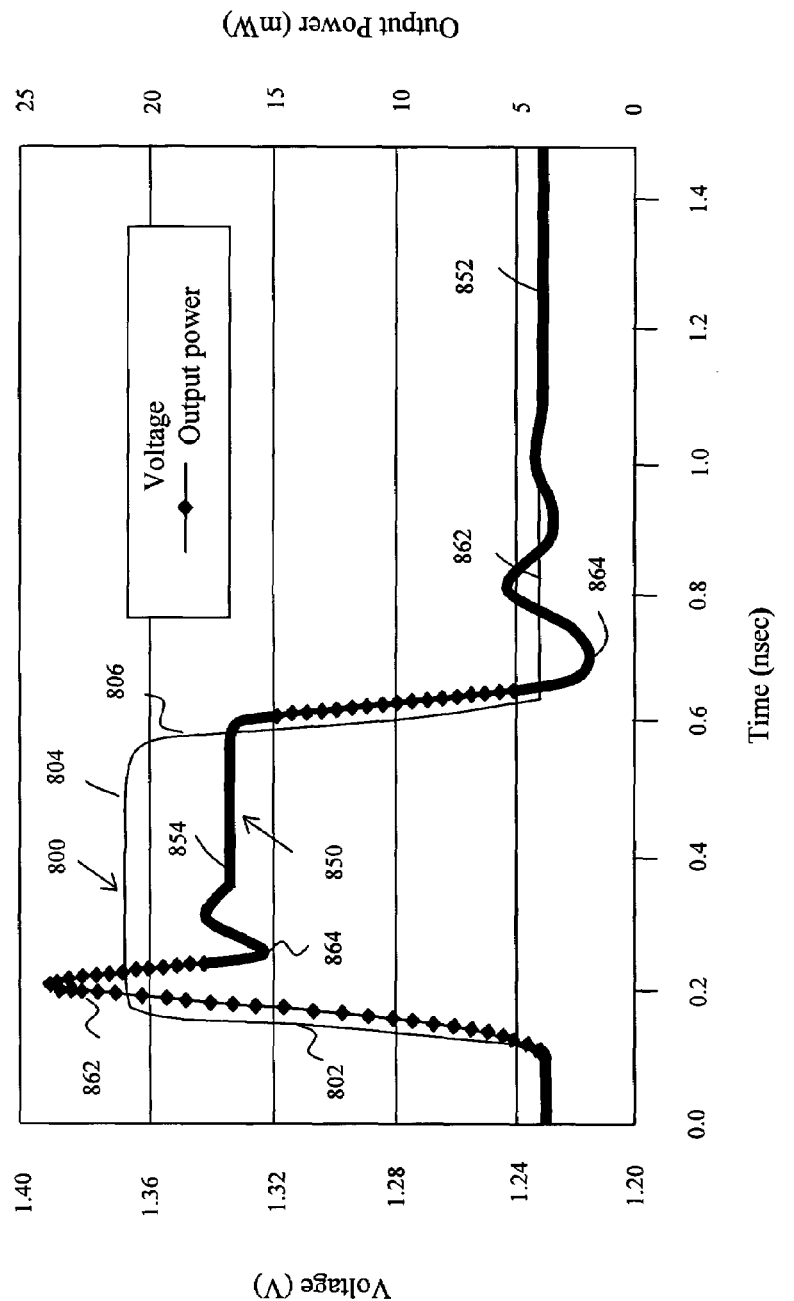
FIG. 8 illustrates a typical prior art drive pulse employed to drive a laser diode, and the resulting laser output, including the resonant/ringing effect.

The term "complex waveform" as used herein refers to a waveform having either the rising edge and/or the falling edge, that employ(s) more than one linear transition rate, one or more non-linear transition rates, and/or more than one transition periods. In other words, the term complex waveform is to be broadly construed to include any waveform other than the simple prior art waveform illustrated in FIG. 8.

Figure 3:
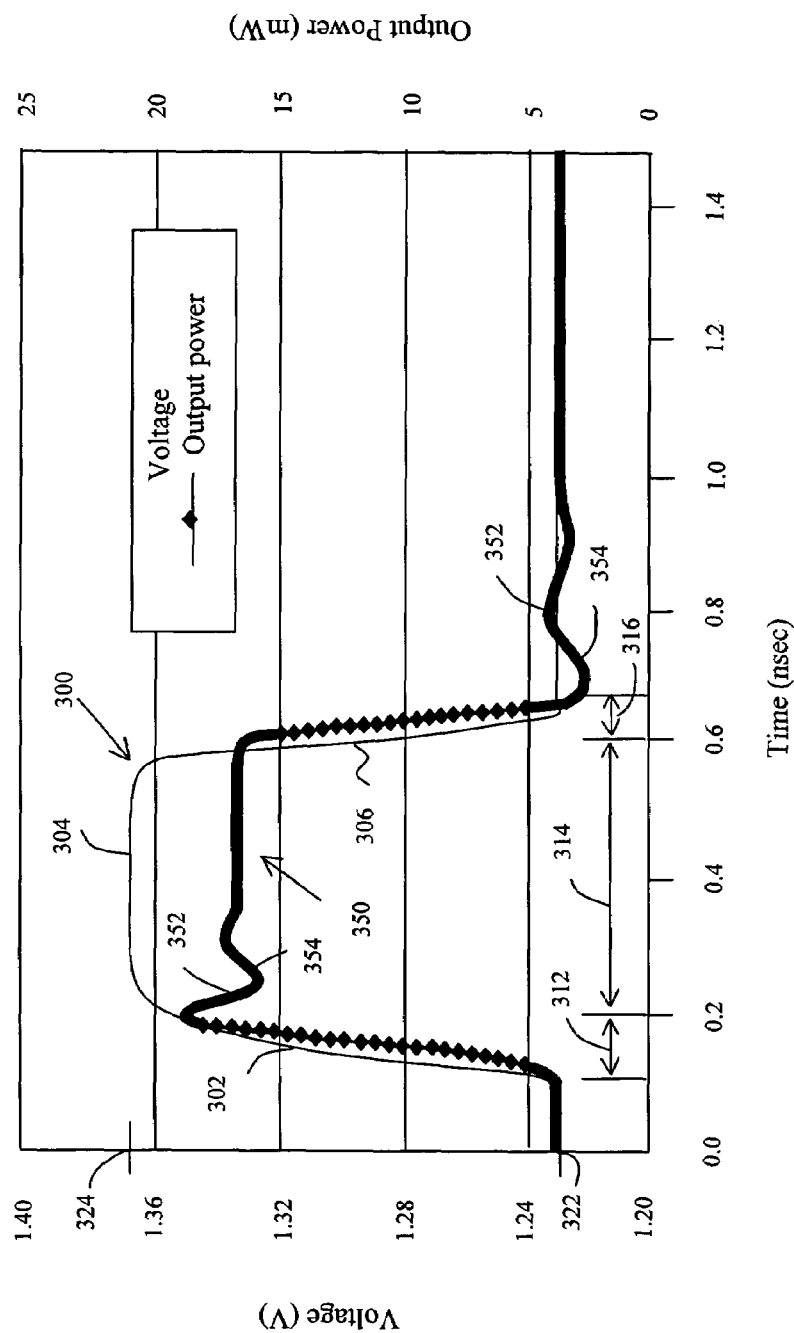
FIG. 3 illustrates a complex waveform employed by the laser driver control unit of FIG. 1 to control the laser driver of FIG. 1 in driving the laser diode of FIG. 1, and the resulting laser output in accordance with one embodiment.

FIG. 3 illustrates a complex waveform employed and the resulting light output, in accordance with one embodiment. As shown, the complex waveform includes rising portion 302 where driving pulse 300 rises from an initial current level 322 to a peak current level 324 in a non-linear transition manner in transition time period 312, second portion 304 (following first portion 302) where driving pulse 300 is sustained at peak current 324 for duration 314, and third portion 306 (following second portion 304) where driving pulse 300 falls/drops back from peak voltage level 324 to initial voltage level 322 in a non-linear transition manner in transition time period 316.

For the embodiment, initial voltage level 322 is approximately 37 mA, whereas peak voltage level 324 is approximately 72 mA. Each of transition time periods 312 and 316 is approximately 0.1 ns, whereas steady time period 314 is approximately 0.4 ns. These currents and times are illustrative only. In alternate embodiments, the present invention may be practiced employing different values.

The non-linear rising transition in transition period 312 is logarithmic like, with the initial ⅓ of the rise occurring almost instantaneously at the beginning of transition time period 312, the next ⅔ of the rise occurring in the last ⅔ of transition time period 312.

The non-linear falling transition in transition period 316 is exponential-decay like with the initial ⅓ of the fall/drop occurring almost instantaneously at the beginning of transition time period 316, the next ⅔ of the fall/drop occurring in the last ⅔ of transition time period 316.

Phrased in another manner, the non-linear rising transition in transition time period 312 may also be thought of as multiple transitions in multiple transition time periods. That is, the first ⅓ of the transition occurs during the small beginning portion of transition time period 312, and the next ⅔ of the transition occurs during the final ⅔ of transition time period 312, with each of these transition time periods having different transition rates.

Similarly, the non-linear falling transition in transition time period 316 may also be thought of as multiple transitions in multiple transition time periods. That is, the first ⅓ of the transition occurs during the small beginning portion of transition time period 316, and the next ⅔ of the transition occurs during the final ⅔ of transition time period 316, with each of these transition time periods having different transition rates.

Resulting output light power 350 is also illustrated in FIG. 3. As it is readily apparent from the illustration, when compared to resulting output light power 850, overshoot 352 and undershoot of 354 of resulting output light power 350 are much smaller, when laser 102 is driven by laser driver 104 using drive pulses with the illustrated complex waveform. In other words, the relaxation oscillation of laser 102 is much reduced. Accordingly, the quality of output light power 350 is superior to output light power 850.

Figure 4:
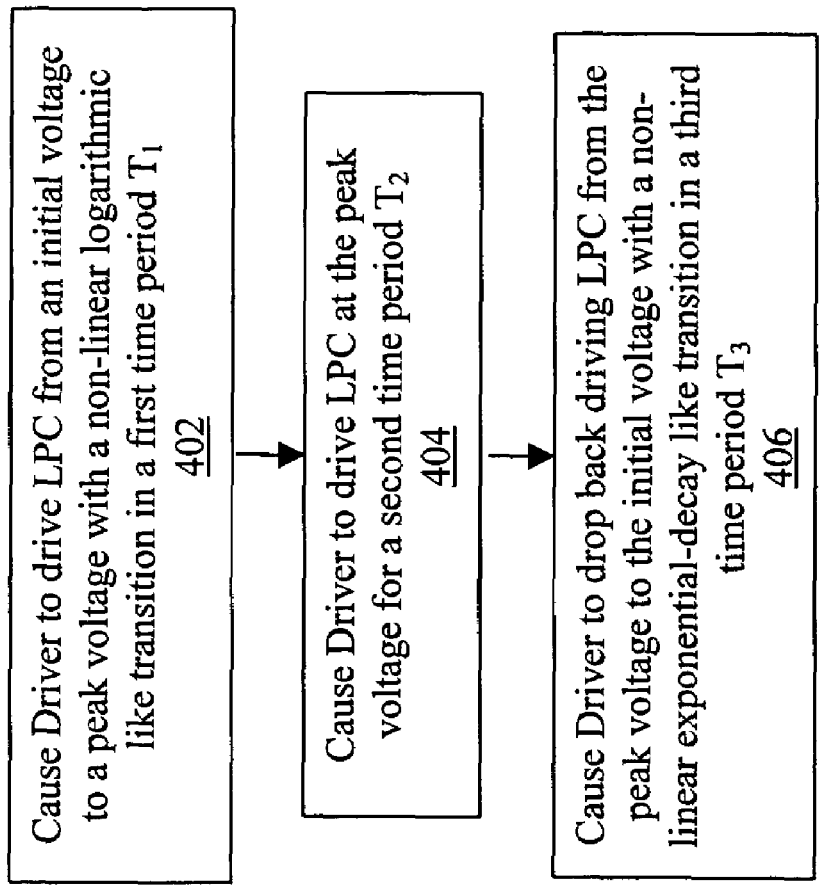
FIG. 4 illustrates the operational logic of the laser driver control unit of FIG. 1 to control the laser driver of FIG. 1 in driving the laser diode of FIG. 1 as depicted in FIG. 3, in accordance with one embodiment.

FIG. 4 illustrates the operating logic of laser driver control unit 106 to cause laser driver 104 to drive the laser 102 with a drive pulse having the complex waveform of FIG. 3, in accordance with one embodiment. As illustrated, laser driver control unit 106 first causes laser driver 104 to increase the current level of the drive pulse from the initial current level to the peak current level in a non-linear (e.g. logarithmic like) manner in a first transition time period T1, block 402.

In various embodiments, laser driver control unit 106 causes laser driver 104 to start the drive with an initial current increase rate, and then subsequently reduces the current increase rate at one or more points in time during the transition period T1.

More specifically, in one embodiment, laser driver control unit 106 causes laser driver 104 to start the drive with an initial current increase rate that effectuates ⅓ of the required rise in the t1 units of time, then reduces the current increase rate, such that the next ⅔ of the required rise is effectuated in the next t2 units of time.

Continuing to refer to FIG. 4, next, laser drive control unit 106 causes laser drive 104 to sustain driving the laser 102 at the final current level for time period T2, block 404.

Then, laser drive control unit 106 causes laser driver 104 to drop back driving laser 102 from the final current level to the initial voltage level in an exponential-decay like manner in transition time period T3, block 406.

In various embodiments, laser driver control unit 106 causes laser driver 104 to cut back the drive with an initial current decrease rate, and then subsequently reduces the current decrease rate at one or more points in time during the transition period T3.

More specifically, in one embodiment, laser driver control unit 106 causes laser driver 104 to start cutting back the drive with an initial current increase rate that effectuates ⅓ of the required fall in the t3 units of time, then reduces the current decrease rate, such that the next ⅔ of the required rise is effectuated in the next t4 units of time.

Figure 5:
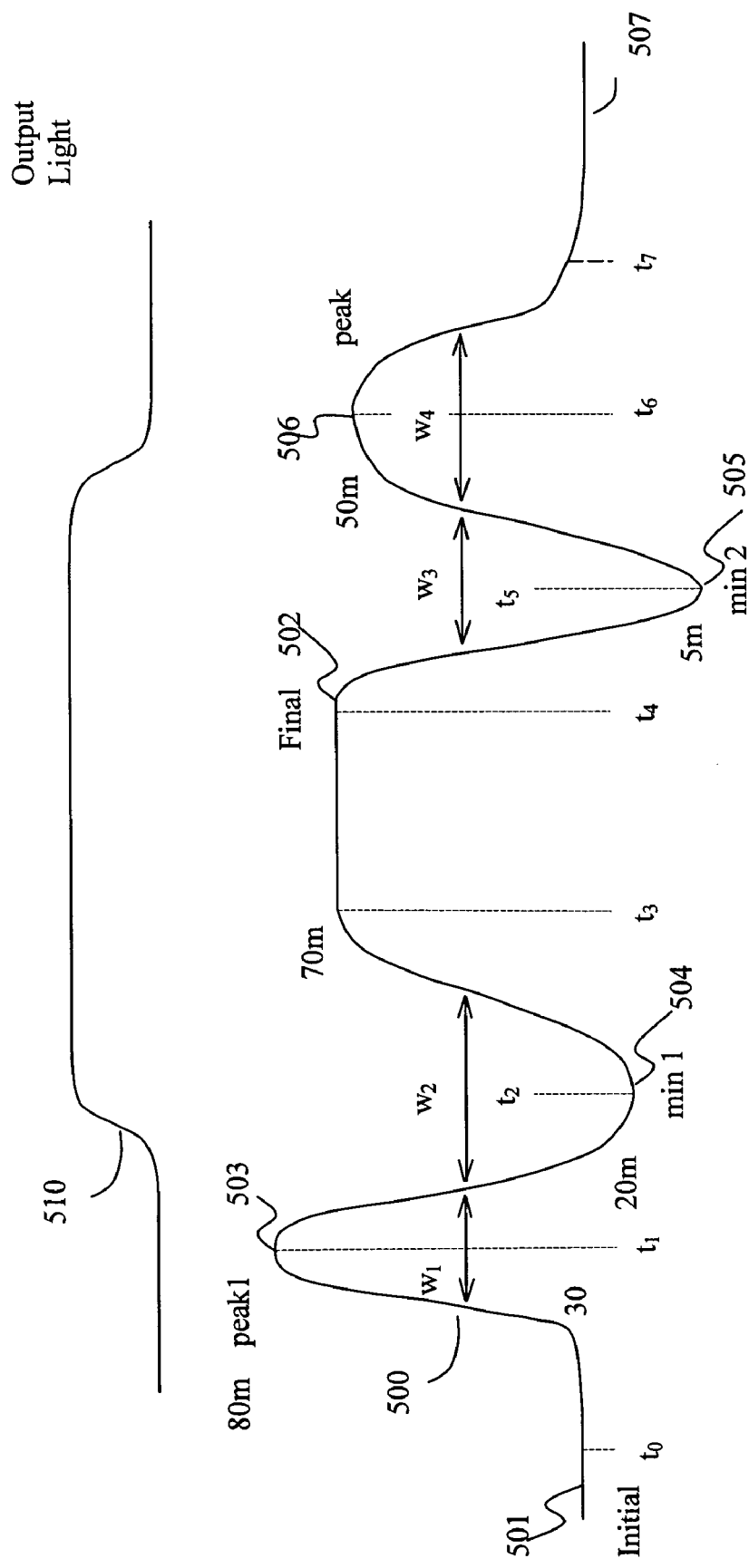
FIG. 5 illustrates another complex waveform employed by the laser driver control unit of FIG. 1 to control the laser driver of FIG. 1 in driving the laser diode of FIG. 1, and the resulting laser output in accordance with another embodiment.

FIG. 5 illustrates another complex waveform employed and the resulting light output, in accordance with another embodiment. As shown, instead of employing a single transition rising portion 302 and a single transition falling portion 306 prior to and after sustained portion 304 as in the case of the complex waveform of FIG. 3, complex waveform 500 of FIG. 5 employs a multiple transitions rising portion, a rising portion with multiple rising transitions interposed with falling transition(s) in between, and a multiple transitions falling portion, a falling portion with multiple falling transitions interposed with rising transition(s) in between, prior to and after sustained portion 502.

More specifically, for the illustrated embodiment, the initial and final peak current levels 501 and 502 are approximately 30 mA and 70 mA respectively. Prior to reaching final peak current level 502 of approximately 70 mA, the drive waveform rises from its initial current level 501 to a transition peak current level 505 of approximately 80 mA and then falls to a transition minimum current level 504 of approximately 20 mA.

Then, from transition minimum current level 504, drive waveform rises to the final peak current level 502 of approximately 70 mA.

The falling waveform is similar but with a reversed order. Prior to returning to the initial current level 501 of approximately 30 mA, the drive waveform falls from final peak current level 502 of approximately 70 mA to a transition minimum current level 505 of approximately 5 mA and then rises to transition peak current level 506 of approximately 50 mA. Then, from transition peak current 506, the drive waveform falls to the initial current level 503 of approximately 30 mA.

In various embodiments, any of the drive currents and times may be adjusted as to produce an output light power signal, 510, that exhibits very fast rise and fall transition and little or no aberrations from relaxation oscillations.

Complex waveform 500 of FIG. 5 may be considered as being characterized by a number of pairs of amplitudes and times. For the multi-transition rise portion, the (amplitude, time) pairs are (initial, t0) (transition peak1, t1) (transition min1, t2) (final, t3). For the multi-transition fall portion, the (amplitude, time) pairs are (final, t4) (transition min2, t5) (transition peak2, t6) (initial, t7).

Accordingly, complex waveform 500 may be controlled/varied by controlling/varying the six amplitudes (initial, transition peak1, transition min1, final, transition min2, transition peak2) and the four pulse widths (w1, w2, w3, w4). Successful control strategies include varying all parameters or subsets of these parameters. For example, one might keep the pulse widths fixed and only vary amplitudes, or visa versa. One might vary some amplitudes and some pulse widths.

In various embodiments, the number of control parameters may be reduced by selecting transition min1 and transition min2 to be the same as the initial current level, and selecting transition peak1 and transition peak2 to be the same as the final current level. For these embodiment, only the pulse widths (w1, w2, w3, and w4.) may need to be further controlled/adjusted.

In other embodiments, pulse widths w1=w2=w3=w4 may be set to be the same. For these embodiments, only the amplitude levels would need to be controlled/adjusted. One advantage of including adjustments to the amplitudes is that it is possible to speed up the edge transitions beyond what is possible with a conventional dive waveform, 802.

By controlling some or all of these parameters, laser 102 may output nearly perfectly settled light pulses with extremely rapid edge transitions. The relaxation oscillation effect of laser light output 510 is much reduced and the edge speeds are faster. Accordingly, the quality of laser light output 510 is also superior to laser light output 850.

Of course, in other embodiments, other variations of controlling complex waveform 500 may also be practiced. Further, additional transitions in the rising and/or falling portions may also be practiced.

Figure 6:
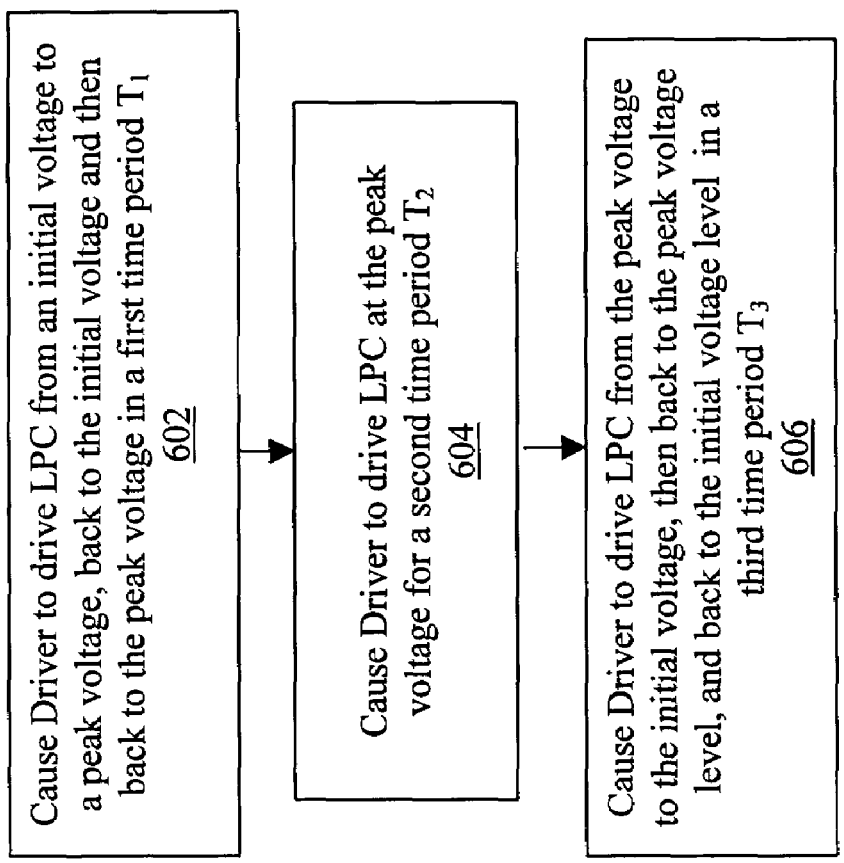
FIG. 6 illustrates the operational logic of the laser driver control unit of FIG. 1 to control the laser driver of FIG. 1 in driving the laser diode of FIG. 1 as depicted in FIG. 5, in accordance with one embodiment.

FIG. 6 illustrates the operating logic of laser driver control unit 106 to cause laser driver 104 to drive laser 102 with a drive pulse having the complex waveform of FIG. 5, in accordance with one embodiment. As illustrated, laser driver control unit 106 first causes laser driver 104 to increase the current level of the drive pulse from the initial current level to the first transition peak current level, then drop the current level back to the first transition minimum current level, and raises the voltage level back to the final peak current level in time periods spanning t0-t1, t1-t2 and t2-t3 respectively, block 602.

Next, laser drive control unit 106 causes laser drive 104 to sustain driving laser 102 at the final peak current level for the time period spanning t3-t4, block 604.

Then, laser drive control unit 106 causes laser driver 104 to drop back driving laser 102 from the final peak current level to the second transition minimum current level, than raises the voltage level back the second transition peak current level, before dropping the current level back to the initial current level again in the time periods spanning t4-t5, t5-t6 and t6-t7, block 606.

In alternate embodiments, where multiple transitions are practiced in the rising and/or falling portion, operation 602 and/or 606 may be repeated multiple times as desired.

In summary, the desired coincidence of the carrier concentration at a desired concentration as photon level of the laser initially arrives at a desired level may be effectuated through the employment of drive pulses with complex waveform, having single or multi-part rising/falling portions, with linear and/or non-linear transition rates.

Further, it is within the anticipation of the present invention that other techniques to affect junction temperature, and/or carrier and/or photon lifetime, absorption and/or reflectivity to achieve the desired substantial forcing of the carrier concentration to a desired concentration as photon level of the laser initially arrives at a desired level, may be employed in addition to or in lieu of the complex waveform techniques earlier described.

Figure 7:
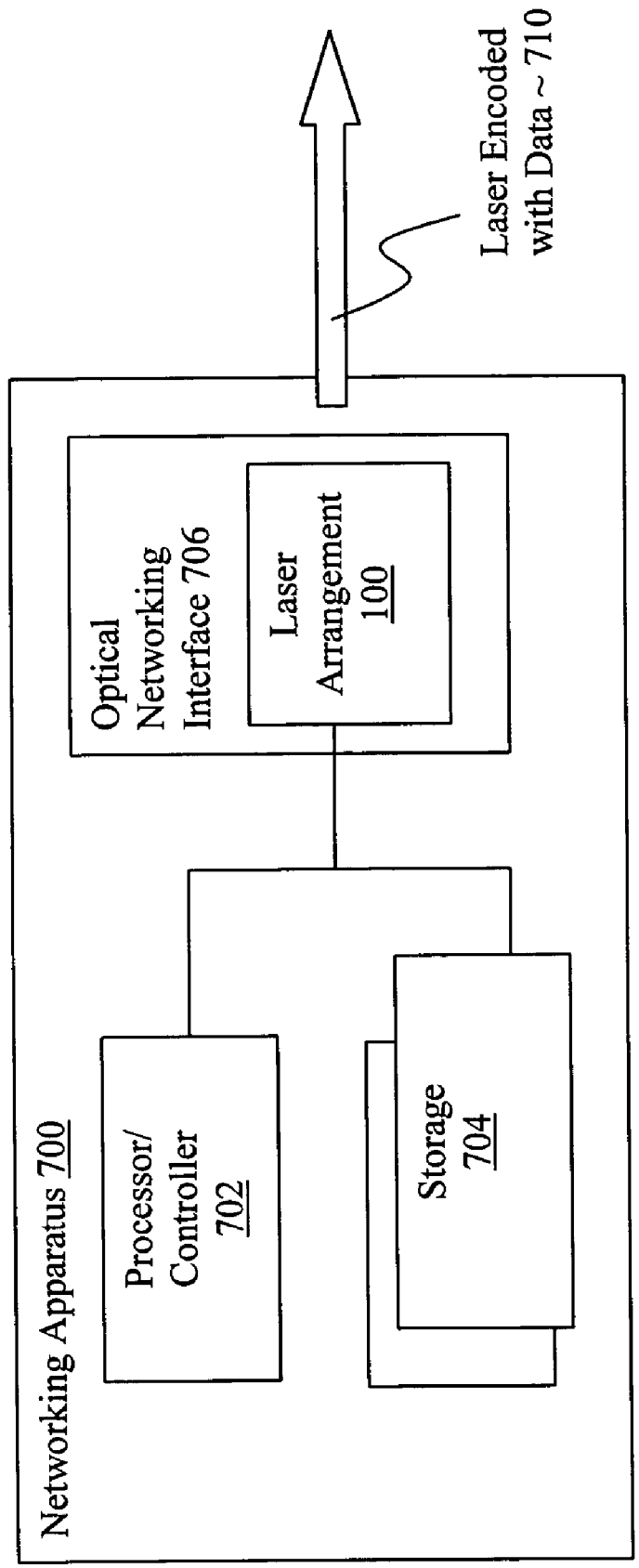
FIG. 7 illustrates a networking apparatus having an optical networking interface incorporated with the teachings of the present invention, in accordance with one example application of the present invention.

FIG. 7 illustrates a networking apparatus having an optical networking interface incorporated with the teachings of the present invention, in accordance with one example use of the present invention.

As illustrated, networking apparatus 700 includes processor/controller 702, storage medium 704 and optical networking interface 706 coupled to each other as shown. Optical networking interface 706 includes in particular, laser arrangement 100 of FIG. 1. For the embodiment, laser drive control unit 106 is also employed to control the drive, i.e. modulate laser output light, in a manner, to encode data to be communicated onto the laser output light.

The term "data" as used herein include "control" as well as "application" or "user" data.

Optical networking interface 706 is employed to optically network or communicate with other optical networking apparatuses (not shown), using laser arrangement 100. Storage medium 704 is employed to store the data to be communicated, and data to be received. Processor/Controller 702 is employed to control the operation of the apparatus.

Except for the inclusion of laser arrangement 100, optical networking interface 706, storage medium 704, and processor/controller 702 represent a broad range of such elements known in the art or to be designed.

For examples, optical networking interface 706 may be an OIF-SPI4-02.0 compliant interface, a 10 GB Ethernet compliant interface, a SONET compliant interface, or other interfaces of the like.

Storage medium 704 may be SRAM, DRAM, Flash or other volatile/non-volatile memory devices of the like.

Processor/controller 702 may be a protocol processor/translator, a network processor or other processors/controllers of the like.

Accordingly, in various embodiments, networking apparatus 700 may be a line card, a gateway, a router, a switch, or other networking devices of the like.

CONCLUSION AND EPILOGUE

Thus, it can be seen from the above descriptions, novel laser drive methods and related apparatuses have been described.

While the present invention has been described in terms of the foregoing embodiments, those skilled in the art will recognize that the invention is not limited to these embodiments. The present invention may be practiced with modification and alteration within the spirit and scope of the appended claims. Specifically, it is foreseen that boundaries of laser driver, driver control unit and laser diode may be modified or even disappear. Thus, for example, some or all aspects of laser driver and/or laser drive control unit may actually be located on or within the laser diode itself. Laser drive levels have been described in terms of current levels flowing through a laser. It is possible to make these equivalent descriptions in terms of the voltage across the laser. Such voltage levels will produce corresponding currents to flow through the laser. Alternative techniques that achieve similar modulations of laser diode current are seen as equivalent to those described in this invention. It is anticipated that most or all aspects of this invention would apply to an optical communication channel that employs a light-producing component other than a laser.

The description is to be regarded as illustrative instead of restrictive on the present invention.

What is claimed is:

1. An apparatus comprising:
a light producing component to generate laser light;
a laser driver coupled to the light producing component adapted to generate a drive pulse to drive the light producing component to generate said laser light; and
a laser driver control unit coupled to the laser driver adapted to control said driving of light producing component by said laser driver by controlling a carrier concentration of the light producing component to achieve a desired concentration as a photon level of the light producing component initially arrives at a desired photon level, wherein the laser driver control unit is adapted to control the laser driver to generate the drive pulse as a complex waveform, wherein the complex waveform drive pulse comprises a first portion where the drive pulse rises from an initial level to a final peak level during a first time period, the final peak level being sustained for a predetermined duration during at least a second portion of the drive pulse corresponding to a second time period following the first time period, the first portion includes a first and a second rising transitions having a first and a second rising transition rates, respectively, the second rising transition rate being slower than the first rising transition rate, the first rising transition occurring at a beginning of the first time period and the second rising transition occurring during rest of the first time period following the beginning of the first time period, the first rising transition accounting for ⅓ of the rise from the initial level to the final peak level and the second rising transition accounting for ⅔ of the rise from the initial level to the final peak level.

2. The apparatus of claim 1, wherein the complex waveform drive pulse comprises a third portion where the drive pulse falls from the final peak level to the initial level in a time period employing a non-linear transition, the third portion occurring during a third time period following the second time period.

3. The apparatus of claim 2, wherein the third portion includes a first and a second falling transitions having a first and a second falling transition rates, respectively, the second falling transition rate being slower than the first falling transition rate, the first falling transition occurring at a beginning of the third time period and the second falling transition occurring during rest of the third time period following the beginning of the third time period, the first falling transition accounting for ⅓ of the fall from the final peak level to the initial level and the second falling transition accounting for ⅔ of the fall from the final peak level to the initial level.

4. The apparatus of claim 1, wherein the light producing component comprises a laser diode.

5. The apparatus of claim 1, wherein the apparatus comprises an integrated circuit, and at least one of said light producing component, laser driver, and laser driver control unit are disposed on said integrated circuit.

6. A laser driving method comprising:
generating a first portion of a drive pulse for driving a light producing component to generate laser light, with the first portion of the drive pulse rising from an initial level to a final peak level in a first time period in a nonlinear transition manner;
generating a second portion of the drive pulse driving the light producing component to generate the laser light, with the second portion of the drive pulse being sustained at the final peak level in a second time period, wherein said drive pulse comprises a complex waveform; and
wherein the first portion includes a first and a second rising transitions having a first and a second rising transition rates, respectively, the second rising transition rate being slower than the first rising transition rate, the first rising transition occurring at a beginning of the first time period and the second rising transition occurring during rest of the first time period following the beginning of the first time period, the first rising transition accounting for ⅓ of the rise from the initial peak level to the final peak level and the second rising transition accounting for ⅔ of the rise from the initial peak level to the final peak level.

7. The method of claim 6, wherein the method further comprises, while performing said generating of the first portion, performing at least a selected one of:
affecting junction temperature within said light producing component;
affecting carrier lifetime within said light producing component;
affecting photon lifetime within said light producing component;
affecting carrier absorption within said light producing component;
affecting photon absorption within said light producing component;

affecting carrier reflectivity within said light producing component; and affecting photon reflectivity within said light producing component.

8. An apparatus comprising:

a light producing component adapted to generate a laser light;

a laser driver coupled to the light producing component and adapted to generate a drive pulse to drive the light producing component to generate the laser light; and a laser driver control unit coupled to the laser driver to control said laser driver to generate said drive pulse as a complex waveform having a first portion where the drive pulse sustains a final peak level during a first time period, and a second portion where the drive pulse falls from the final peak level to the initial level in a second time period in a non-linear transition manner, the second portion includes a first and a second falling transitions having a first and a second falling transition rates, respectively, the second falling transition rate being slower than the first falling transition rate, the first falling transition occurring at a beginning of the second time period and the second falling transition occurring during rest of the second time period following the beginning of the second time period, the first falling transition accounting for $\frac{1}{3}$ of the fall from the final peak level to the initial level and the second falling transition accounting for $\frac{2}{3}$ of the fall from the final peak level to the initial peak level.

9. An apparatus comprising:

an optical networking interface to optically network with another apparatus, with the optical networking interface including:

a laser arrangement having a light producing component including a laser to generate a laser light, a laser driver coupled to the light producing component adapted to generate a drive pulse as a complex waveform to drive the light producing component to generate the laser light, and a laser driver control/encoder coupled to the laser driver and adapted both to control said driving of said laser by said laser driver to encode data on said laser light and to control said driving of said laser by controlling a carrier concentration of the laser to achieve a desired concentration as a photon level of the laser initially arrives at a desired photon level, wherein the complex waveform drive pulse comprises a first portion where the drive pulse rises from an initial level to a final peak level during a first time period, the final peak level being sustained for a predetermined duration during at least a second portion of the drive pulse corresponding to a second time period following the first time period, the first portion includes a first and a second rising transitions having a first and a second rising transition rates, respectively, the second rising transition rate being slower than the first rising transition rate, the first rising transition occurring at a beginning of the first time period and the second rising transition occurring during rest of the first time period following the beginning of the first time period, the first rising transition accounting for $\frac{1}{3}$ of the rise from the initial level to the final peak level and the second rising transition accounting for $\frac{2}{3}$ of the rise from the initial level to the final peak level; and storage medium coupled to the optical networking interface, said storage medium having data stored therein for encoding said laser light; and processor/controller coupled to the storage medium and the optical networking interface to control operation of the apparatus.

10. The apparatus of claim 9, wherein the complex waveform comprises:

a second portion where the drive pulse drops from the final peak level to the initial level in a second time period in a second non-linear transition manner.

* * * * *